United States Patent [19]

Merklinger et al.

[11] 4,174,503
[45] Nov. 13, 1979

[54] MODULAR LOW NOISE PREAMPLIFIER

[75] Inventors: Harold M. Merklinger; Orest Z. Bluy, both of Dartmouth, Canada

[73] Assignee: Her Majesty the Queen in right of Canada, Ottawa, Canada

[21] Appl. No.: 922,360

[22] Filed: Jul. 6, 1978

[30] Foreign Application Priority Data

Nov. 25, 1977 [CA] Canada .................................. 291786

[51] Int. Cl.$^2$ ............................................... H03F 3/16
[52] U.S. Cl. .................................... 330/300; 330/293; 330/298; 330/311
[58] Field of Search ...................... 330/95, 207 P, 277, 330/293, 298, 300, 311

[56] References Cited

U.S. PATENT DOCUMENTS

| | | | |
|---|---|---|---|
| 3,309,617 | 3/1967 | Lancaster et al. .................... | 330/283 |
| 3,927,383 | 12/1975 | Fjarlie et al. ...................... | 330/277 X |

FOREIGN PATENT DOCUMENTS 2514482  10/1976  Fed. Rep. of Germany ........... 330/300

OTHER PUBLICATIONS

Ridler, "Tape Pre-Amplifier Using F.E.T.", *Wireless World,* Sep. 1967, pp. 433-434.

*Primary Examiner*—James B. Mullins
*Attorney, Agent, or Firm*—Larson, Taylor and Hinds

[57] ABSTRACT

Disclosed is a low noise amplifier capable of handling large signals without significant distortion and which is particularly useful as the first electronic stage in hydrophone array systems utilizing piezoelectric sensor elements. The amplifier comprises three stages. The first stage uses an input field effect transistor (FET), which is protected against overload by very low leakage current diodes, and which acts as a voltage-to-current converter. The second stage comprises a junction transistor connected in a common emitter configuration which acts as a current-to-voltage converter. The third stage is a further junction transistor connected as an emitter follower. The overall gain of the amplifier is controlled by a feedback connection from the third stage to the first stage. The second and third stages are powered by a bipolar power supply. The second stage junction transistor has its emitter connected to the positive supply voltage by a pair of diodes forward biased by the supply voltage to provide low distortion and fast overload recovery. The third stage includes a second field effect transistor (FET), in series with the junction transistor of the third stage, which allows enhanced output drive capability. Resistors are connected in series with the base and collector of the third stage junction transistor to provide output short circuit protection.

4 Claims, 6 Drawing Figures

MODULAR LOW NOISE PREAMPLIFIER

This invention comprises a low noise amplifier capable of handling large signals without significant distortion. The amplifier is particularly useful as the first electronic stage in systems using piezoelectric signal sources although it is not restricted to such signal sources.

In order to measure weak signals, it is important to have low noise levels. Large unwanted signals are frequently encountered along with the signals desired to be detected. Attempts to eliminate these unwanted signals, prior to amplification, will often result in deterioration in the ultimate signal-to-noise ratio. It is preferable, if at all possible, to amplify the entire signal in a linear fashion, and then filter. Thus, it is desirable for a preamplifier to have a large signal handling capability as well as low-noise characteristics. In addition, such a preamplifier should have a gain which is very stable with respect to changes in supply voltage, time and frequency.

Because of the linearity requirement and the stability objective, a feedback design is employed in the present invention with a high quality junction-type field effect input transistor (FET), this having been found to be the most suitable for high impedance, low-frequency applications.

Although the amplifier according to the invention is DC coupled, it is intended to be usable to an arbitrarily low frequency, rather than simply as a DC amplifier. The DC performance is relatively poor by the usual standards for operational amplifiers, but it is entirely adequate for the intended purposes of this amplifier.

In accordance with this invention there is provided an amplifier comprising an input stage, a second stage and a third stage, said input stage comprising a field effect transistor (FET) connected in a common source configuration and having a gate electrode to which is connected an input terminal, said input terminal being connected to a pair of oppositely poled reverse-biased input protection diodes, said field effect transistor (FET) acting as a voltage-to-current converter and feeding said second stage, said second stage comprising a junction transistor connected in a common emitter configuration and acting as a current-to-voltage converter, said third stage comprising a further junction transistor connected as an emitter follower, overall gain of the amplifier being controlled by a feedback connection from the third stage to the first stage, said second and third stages being powered by a bipolar power supply, said second stage junction transistor having an emitter connected to positive supply voltage, said third stage including a second field effect transistor (FET) connected in series with said further junction transistor to enhance output drive capability, said further junction transistor having a base and a collector with resistors connected in series with them to provide output short circuit protection.

The design and operation of the circuit will be described in greater detail, with reference to the following figures, in which.

Figure 4:
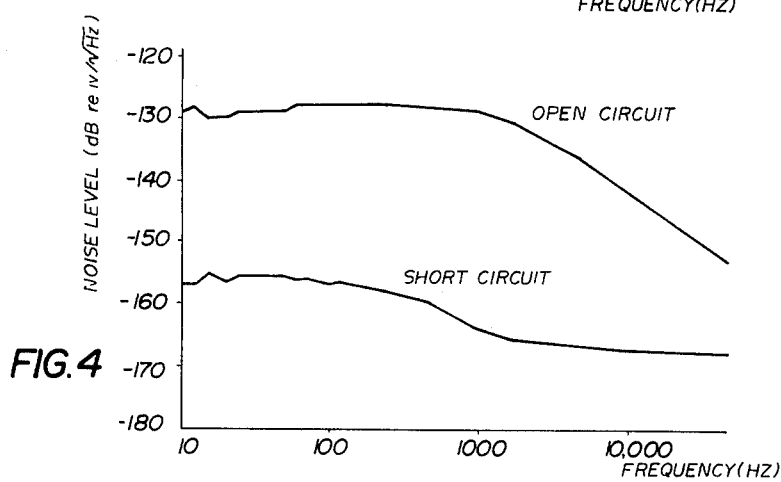
Figure 5:
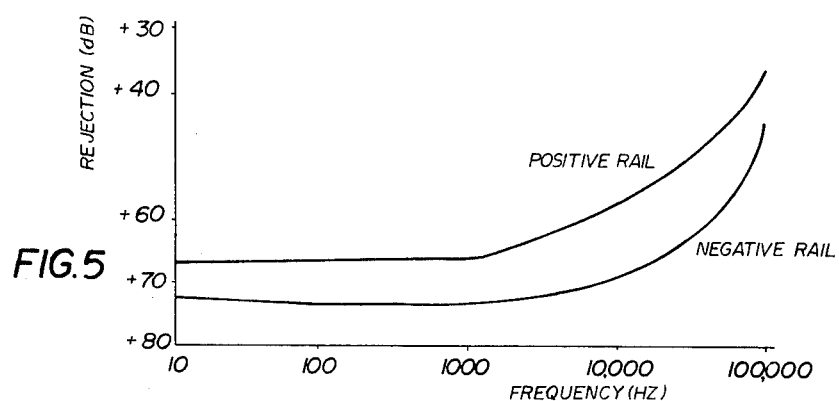
Figure 6:
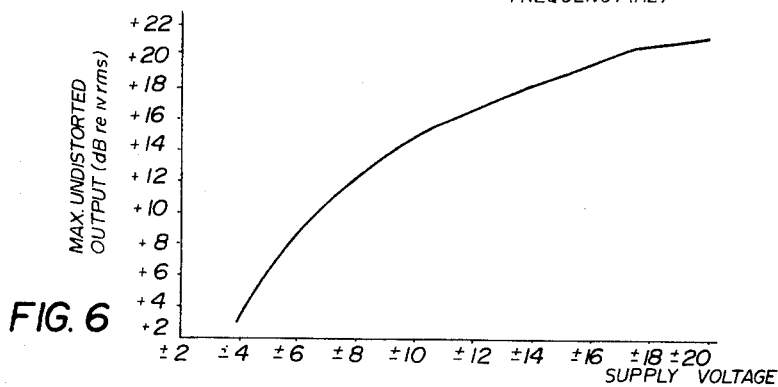

FIG. 4 indicates typical noise level curves for the amplifier;

FIG. 5 indicates typical rejection (of power supply noise) curves;

FIG. 6 is a curve of maximum sinewave voltage output versus power supply voltage.

Figure 1:
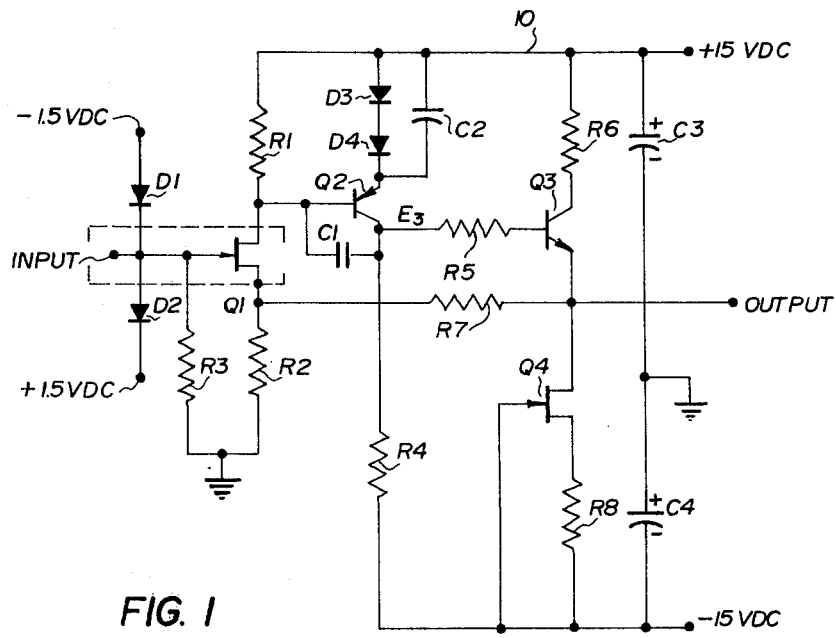
FIG. 1 is a schematic diagram of the amplifier according to the invention.

Referring to FIG. 1, the input FET Q1, protected by diodes D1 and D2, acts as a voltage-to-current converter, current feeding the second stage. The second stage includes a junction transistor Q2 connected as a common-emitter current-to-voltage converter for generating an output across R4. In this embodiment, Q2 is a PNP transistor. The current amplification in the second stage is the major source of gain in the amplifier. The third stage is simply an emitter follower Q3 connected in series with Q4 which acts as a current source. The output of the amplifier is taken from the emitter of NPN transistor Q3. Overall gain of the amplifier is determined by the values of the feedback resistors R2 and R7. R1, together with diodes D3 and D4, provides static bias for the second stage. The capacitor C2 ensures a low input impedance for this stage, helping to divert the dynamic current through Q2 instead of R1. The Miller capacitor C1 restricts the gain-bandwidth product of the amplifier, ensuring stability. Resistors R5 and R6 in series with the base and emitter of Q3, respectively, are for current limiting in case of an output short circuit. The capacitors C3 and C4 are for supply line decoupling. A reasonable thermal stability is obtained despite the unbalanced design, and the design has been found to be very successful.

The input stage is a common source FET amplifier comprising FET Q1 which has a source resistor R2 and a drain load which is equivalent to R1 in parallel with the input impedance of the second stage. R2 has a degenerative effect, reducing the effective transconductance $g_m^1$ of the stage to $g_m/(1+g_m R2)$ where $g_m$ is the actual transconductance of the FET at operating bias. For noise considerations, R2 should be kept as small as reasonably possible. In addition to contributing noise directly, the DC drop across R2 biases Q1 so as to reduce conductance. With R4 having a typical value of about 360 ohms, $g_m^1$ is about 40% of the zero bias $g_m$. The drain load will typically be about 4000 ohms and the voltage gain of the input stage will be about 5 in the absence of feedback through R7.

The second stage is a common emitter stage comprising junction transistor Q2 and associated passive elements. The forward biased diodes, D3 and D4 together with the base-emitter drop of Q2, allow the DC voltage across R1 to stand at about 2 volts. The absence of diodes would reduce the value of R1 by about a factor of 3 and hence reduce the gain of the first stage and shunt a considerable portion of the available signal current to the positive supply rail 10. The diodes themselves serve no dynamic role and hence are heavily bypassed by capacitor C2. The input impedance $h_{ie}$ of Q2 is approximately $0.05\beta/i$ where $\beta$ is the current gain of Q2 and i is the collector current. The DC voltage across R4 must be about 16 volts. Hence $i=16/R4$ and $h_{ie}=0.5\beta R4/16$. The collector signal current is given by $\beta e_2 R4/h_{ie}$ and hence the output signal voltage $e_3$ is $\beta e_2 R4/h_{ie}$, where $e_2$ is the signal voltage across R1. The second stage voltage gain is thus approximately $16\beta R4/0.05\beta R4 \approx 320$. In actual circuits the gain has been found to be slightly higher at about 440. The overall gain for the first two stages will be about 2,200.

At frequencies above about 100 Hz, C1 acts as a miller feedback capacitor, reducing both $h_{ie}$ and the voltage gain. The high frequency voltage gain of the first two stages is given by $g_m{}^1 XC1$ where $XC1$ is the reactance of C1. For a value of 33 pf, the typical gain-bandwidth product is about 5 MHz. It is important to the stability of the overall circuit that the gainbandwidth product be less than the $f_T$ of the transistors Q2 and Q3.

Resistor R1 is adjusted in each amplifier so as to bias Q2 for zero voltage at the amplifier output.

The two diodes in the emitter of Q2 could be replaced with a resistor of about 2.9 K-ohms. The use of a resistor causes a degenerative effect at low frequencies reducing the amplifier gain to about 80 at DC. This substitution will also result in an overload recovery time of about 3 seconds instead of 30 msec.

The third stage comprises a junction transistor Q3 connected as an emitter follower. Field effect transistor Q4 in series with Q3 is a current source used to "pull down" the output without loading it. The operating current through Q4 must be sufficient to drive R7 plus the external load to $-13$ volts if the full output potential of the amplifier is to be realized. Resistors R5 and R6 serve to limit base and collector currents in the event of an output short circuit.

Input protection is provided by diodes D1 and D2, which can be a pair of FD300 diodes. Over-voltage protection may be obtained either by connecting these diodes to ground or to a bias source such as a pair of mercury cells. If the diodes are connected to ground, an additional resistance (greater than 13 megohms) will be placed across R3, lowering the input impedance of the amplifier. This additional resistance represents the dynamic zero-bias resistance of the diodes themselves and as such will be a nonlinear function of input level. In order to reduce the input loading while still protecting the amplifier, the diodes must be back-biased by about 1 to 1.5 volts. Small mercury cells can work well here. A resistor chain may be used for bias provided the diode terminals are heavily bypassed to ground with capacitors.

The diodes alone may not be sufficient protection in some cases, e.g. when the signal source is a piezoelectric hydrophone. Pyroelectric charges in piezoelectric hydrophones may reach kilovolt levels. The connection of a charged hydrophone to a preamplifier may result in surge currents of many amperes. Tests with these amplifiers indicated that surge currents up to about five amperes could be tolerated. On this basis, a resistor can be added in series with the input to limit surge current to five amperes or less. The resistor value should be about one ohm for every five volts of protection required. If 2000 volt transients are possible, a resistor of at least 400 ohms should be used. This series resistor will cause a deterioration in noise performance, particularly at frequencies greater than a few hundred hertz.

Figure 2:
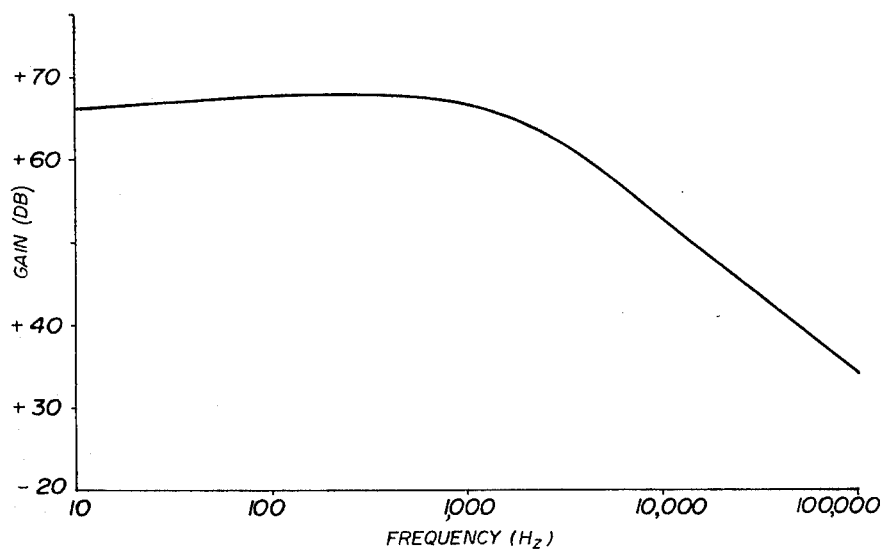
FIG. 2 is a typical curve of the open loop gain versus frequency of the amplifier.

The open loop gain of an amplifier in accordance with the invention is shown in FIG. 2. The droop at low frequencies is caused by the increasing impedance of C2 as frequency falls.

Figure 3:
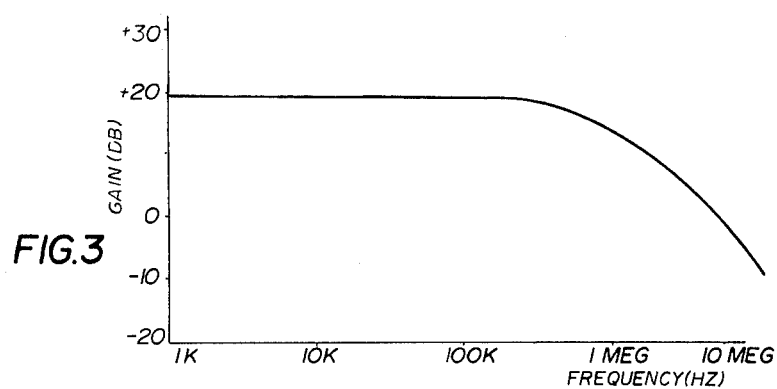
FIG. 3 is a typical frequency response curve (closed loop gain) for the amplifier.

The closed loop gain is controlled by R7 and R2, and is given approximately by $R2/(R2+R7)$. The closed loop gain is shown in FIG. 3.

The open circuit and short circuit noise spectra are shown in FIG. 4. The open circuit noise is simply that noise associated with the input impedance. A further resistor in series with the input will necessarily increase the short circuit noise by the noise power associated with that resistor. The protection diodes, D1 and D2, were not found to contribute noticeably to the noise with a 10 megohm input resistor R3.

In the absence of obvious clipping, the harmonic distortion would seem to be unmeasurable below 20 KHz. Where it can be measured, total harmonic distortion appears to obey the formula $1.5 \times 10^{-5} Vf2 \%$ where V is the rms output voltage and f is the frequency in kilohertz. Below 1 KHz, distortion probably levels off at $1.5 \times 10^{-5} V\%$.

Rejection of power supply noise as a function of frequency is shown in FIG. 5. These figures are referred to the input. One millivolt of supply noise looks like less than 1 volt of input noise below 5 KHz.

Maximum output voltage swing as a function of power supply voltage is shown in FIG. 6. It is assumed that the supplies are balanced with respect to ground. Below $\pm 4.5$ volts, the amplifier continues to function but gain is reduced. The amplifier is intended for the power supply range $\pm 12$ to $\pm 16$ volts.

The preamplifier of this invention is quite easily constructed in a modular, plug-in form, by modern manufacturing techniques for integrated circuits. It is to be noted that many modifications to the basic circuit of the amplifier presented herein are possible, and are contemplated by this invention. For instance, different transistor types may be used, the gain may be changed, and impedance levels and bandwidths may be changed.

The following components have been used in an actual amplifier according to the invention and the curves of FIGS. 2 and 6 relate to an amplifier using these components. However, it will be obvious to those skilled in the art that other components could be used.

Q1—2N5556
Q2—2N4250
Q3—2N916
Q4—2N819
D1,D2—FD300
D3,D4—IN914
C1—33 pf
C2—330 µf
C3—1 µf
C4—1 µf
R1—(varies—see text)
R2—360Ω
R3—10 MΩ
R4—47 kΩ
R5—100Ω
R6—100Ω
R7—3.3 kΩ

It will be appreciated that a complementary design may also be used. That is, Q1 may be replaced by a P-channel FET, Q2 by an NPN junction transistor and Q3 by a PNP junction transistor, with diodes D3 and D4 being reversed and the positive and negative voltage supplies being interchanged. Q4 may be either P-channel or N-channel provided it is appropriately biased. It will also be obvious that diodes D3 and D4 may be replaced by any suitable number of forward biased diodes or by one or more back-biased zener or avalanche diodes without altering the basic design.

The amplifier is preferably constructed in a modular plug-in form. The circuit components may be assembled on a printed circuit board and then encapsulated. The resulting unit is relatively small and preferably has pin designations indelibly printed on it. The colour of the encapsulant may be used as a code to indicate the value of input impedence R3.

If desired a pin may be provided which connects to the junction of R2 and R7 so that an external trim resistor may be connected between said pin and the output. The external trim resistor enables adjustment of the overall gain of the amplifier to some lower value.

The embodiments of the invention in which an exclusive property or privilege is claimed are defined as follows:

1. An amplifier comprising an input stage, a second stage and a third stage, said input stage comprising a field effect transistor (FET) connected in a common source configuration and having a gate electrode to which is connected an input terminal, said input terminal being connected to a pair of oppositely poled reverse-biased input protection diodes, said field effect transistor (FET) acting as a voltage-to-current converter and feeding said second stage, said second stage comprising a PNP junction transistor connected in a common emitter configuration and acting as a current-to-voltage converter, said third stage comprising a further junction transistor connected as an emitter follower, a feedback connection from the third stage to the first stage, for controlling the overall gain of the amplifier, said second and third stages being powered by a bipolar power supply with said second stage junction transistor having an emitter connected to positive supply voltage, said third stage including a second field effect transistor (FET) connected in series with said further junction transistor to enhance output dirve capability, said further junction transistor having a base and a collector with resistors connected in series with them to provide output short circuit protection.

2. An amplifier according to claim 1 wherein said second stage junction transistor has its emitter connected to the positive supply voltage via a pair of diodes forward biased by said positive supply voltage and bypassed by a capacitor to provide low distortion and fast overload recovery.

3. An amplifier according to claim 1 wherein said second stage junction transistor has its emitter connected to the positive supply voltage via at least one resistive element bypassed by a capacitor to provide low distortion and fast overload recovery.

4. An amplifier comprising an input terminal connected to a gate electrode of a first field effect transistor and to a pair of oppositely poled reverse-biased input protection diodes, said field effect transistor having a drain electrode connected through a first resistor to a positive DC supply voltage and a source electrode connected through a second resistor to ground, said gate electrode being connected to ground through a third resistor, said drain electrode being connected to the base of a PNP transistor having an emitter connected to said positive DC supply voltage via a second pair of diodes in parallel with a capacitor, said second pair of diodes being forward biased by said positive DC supply voltage, said PNP transistor having a collector connected via a fourth resistor to a negative DC supply voltage and, via a fifth resistor, to the base of an NPN transistor, said NPN transistor having a collector connected via a sixth resistor to said positive DC supply voltage and an emitter connected to an output terminal and, via a current source field effect transistor, to said negative DC supply voltage, the emitter of said NPN transistor being connected via a seventh resistor to the source electrode of said first field effect transistor.

* * * * *